| (12) | United States Patent | (10) Patent No.: | US 7,764,077 B2 |
|---|---|---|---|
| | Naruta | (45) Date of Patent: | Jul. 27, 2010 |

(54) SEMICONDUCTOR DEVICE INCLUDING SEMICONDUCTOR EVALUATION ELEMENT, AND EVALUATION METHOD USING SEMICONDUCTOR DEVICE

(75) Inventor: Yasuhisa Naruta, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 87 days.

(21) Appl. No.: 12/213,664

(22) Filed: Jun. 23, 2008

(65) Prior Publication Data

US 2009/0001368 A1    Jan. 1, 2009

(30) Foreign Application Priority Data

Jun. 27, 2007    (JP)    ............................. 2007-169564

(51) Int. Cl.
  *G01R 31/26*    (2006.01)
(52) U.S. Cl. .................. 324/761; 257/48; 257/E23.002
(58) Field of Classification Search .................. 257/48, 257/E23.002; 324/761, 768, 769
  See application file for complete search history.

(56) References Cited

U.S. PATENT DOCUMENTS 5,760,600 A * 6/1998 Kasai ......................... 324/769

FOREIGN PATENT DOCUMENTS

JP    9-64139    3/1997

OTHER PUBLICATIONS

R. Q. Williams, et al., "Compact Model Methodology for Dual-Stress Nitride Liner Films in a 90nm SOI ULSI Technology", NTSI-Nanotech 2006, www.nsti.org, ISBN 0-9767985-8-1 vol. 3, 2006.

* cited by examiner

*Primary Examiner*—Thomas L Dickey
(74) *Attorney, Agent, or Firm*—McGinn IP Law Group, PLLC

(57) ABSTRACT

Provided are a semiconductor evaluation element capable of analytically estimating the amount of DC variation of a MOS transistor which is caused by formed contacts, and an evaluation circuit and an evaluation method using the semiconductor evaluation element. The semiconductor evaluation element such as a MOS transistor includes: a gate; diffusion layers; measurement contacts; and floating contacts. The diffusion layers are formed on both sides of the gate and serve as a source and a drain. The measurement contacts are provided in positions apart from the gate on the diffusion layers. The floating contacts are provided between the gate and the measurement contacts to connect electrically isolated metal layers with the diffusion layers.

8 Claims, 6 Drawing Sheets

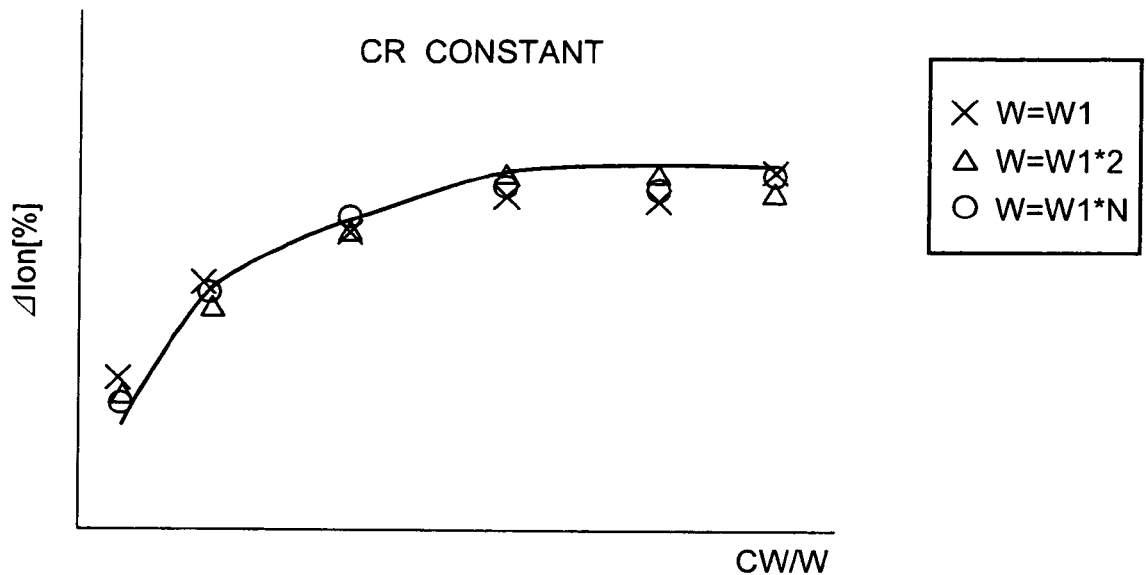

SEMICONDUCTOR DEVICE INCLUDING SEMICONDUCTOR EVALUATION ELEMENT, AND EVALUATION METHOD USING SEMICONDUCTOR DEVICE

BACKGROUND OF THE INVENTION

1. Field of the Invention

The present invention relates to a semiconductor device including a semiconductor evaluation element for evaluating characteristics, and an evaluation method using the semiconductor device.

2. Description of the Related Art

The inventor(s) of the present invention conducted the following analyses.

Characteristics of insulated gate field effect transistors are measured using an evaluation circuit and an evaluation element which are called as a test element group (TEG). For example, an insulated gate field effect transistor such as a metal oxide semiconductor field effect transistor (MOSFET) has a contact resistance between an electrode layer such as a source or a gate and a diffusion layer in a semiconductor. The contact resistance affects a direct current (DC) characteristic such as a transconductance (gm) and a high-frequency characteristic such as a cutoff frequency.

For example, JP 09-064139 A discloses an evaluation element and an evaluation circuit which evaluate characteristics of the insulated gate field effect transistor with and without the influence of the contact resistance. The evaluation element includes a first diffusion layer region and a second diffusion layer region between which a gate electrode of the insulated gate field effect transistor to be evaluated is interposed. A drain electrode is connected with the first diffusion layer and a source electrode is connected with the second diffusion layer. A first electrode connected with the first diffusion layer is formed father from the gate electrode than the drain electrode on the first diffusion layer. A second electrode connected with the second diffusion layer is formed father from the gate electrode than the source electrode on the second diffusion layer. A first measurement terminal is connected with the gate electrode through a first wiring. A second measurement terminal and a third measurement terminal are connected with the drain electrode through a second wiring. A fourth measurement terminal is connected with the first electrode through a third wiring. A fifth measurement terminal and a sixth measurement terminal are connected with the source electrode through a fourth wiring. A seventh measurement terminal is connected with the second electrode through a fifth wiring. The evaluation circuit, using all of the measurement terminals in the evaluation element, enables to evaluate the characteristics of the insulated gate field effect transistor with and without the influence of the contact resistance.

Recently, it has been reported that current characteristics of a MOS transistor are significantly affected depending on the number of contacts and a contact position in the MOS transistor in the case where an element size reduces (for example, "Compact Model Methodology for Dual-Stress Nitride Liner Films in a 90 nm SOI ULSI Technology" R. Q. Williams, D. Chidambarrao, J. H. McCullen, S. Narasimha, T. G. Mitchell and D. Onsongo, NTSI-Nanotech 2006, www.nsti.org, ISBN 0-9767985-8-1 Vol. 3, 2006). This indicates that a stress applied to the channel region by a stopper film is reduced by the formed contacts to significantly affect the current characteristics.

Developed advanced processes include a technique using such an effect to form a CAP film (stopper film) for applying the intended stress to the channel region in order to improve the characteristics of the MOS transistor. However, the stress applied by the CAP film varies according to a contact formation condition to significantly affect the DC characteristic of the MOS transistor. Therefore, it is important to analytically estimate the amount of DC variation of the MOS transistor which is caused by the formed contacts.

Characteristics of semiconductor elements are measured using an evaluation circuit including an evaluation element called as the test element group (TEG). The following analyses are given by the present invention. For example, as shown in FIG. 1A, an evaluation element for measuring a direct current (DC) characteristic of a metal oxide semiconductor field effect transistor (MOSFET) includes diffusion layers 102 and 103 which are provided on both sides of a gate 101 and correspond to a source and a drain. Metal layers 108 and 109 serving as wirings are connected with the diffusion layers 102 and 103 through contacts 105 and 106. Voltages are applied to respective portions of the MOS transistor and currents flowing at this time are observed to measure the DC characteristic.

When DC characteristic is to be measured, as shown in FIGS. 1A and 1B, a plurality of evaluation elements whose distances CR between the gate 101 and the contact 105 (106) are different from each other are prepared and a current value is measured for each of the evaluation elements. Therefore, a diffusion layer resistance can be estimated with the distance CR as a parameter, based on the changes in the current value for each of the evaluation elements.

However, even when the influence of a variation in stress which is caused according to the contact position is to be determined using the DC measurement layout of the MOS transistor which is disclosed in JP 09-064139 A or the DC measurement layout shown in FIGS. 1A and 1B, not only a variation in DC characteristic due to the variation in stress but also a variation in parasitic resistance component of the diffusion layer resistance occurs. As a result, the DC change caused by the stress cannot be separated from the DC change caused by parasitic resistance.

SUMMARY

According to an aspect of the present invention, there is provided a semiconductor evaluation element, including: a gate (11); diffusion layers (12 and 13); measurement contacts (15 and 16); and floating contacts (25 and 26). The diffusion layers (12 and 13) are formed on both sides of the gate (11) and serve as a source and a drain. The measurement contacts (15 and 16) are provided in positions apart from the gate (11) on the diffusion layers (12 and 13). The floating contacts (25 and 26) are provided between the gate (11) and the measurement contacts (15 and 16) to connect electrically isolated metal layers (28 and 29) with the diffusion layers (12 and 13).

A semiconductor integrated circuit device according to the present invention includes a plurality of the semiconductor evaluation elements as described above. In a first plurality of the semiconductor evaluation elements, a ratio CW/W between a contact width CW of each of the floating contacts (25 and 26) and a transistor width W of each of the semiconductor evaluation elements is fixed to a predetermined value, and distances CR between the gate (11) and the floating contacts (25 and 26) are different from one another. In a second plurality of semiconductor evaluation elements of the semiconductor evaluation elements, the distance CR between the gate (11) and each of the floating contacts (25 and 26) is fixed to a predetermined value and the ratios CW/W between the contact width CW of the floating contacts (25 and 26) and the transistor widths W of the semiconductor evaluation elements are different from one another.

According to another aspect of the present invention, there is provided a measurement method of measuring influences caused by formed contacts on a DC characteristic of each of a plurality of semiconductor evaluation elements by using a semiconductor device including the plurality of semiconductor evaluation elements each including: a gate (11); diffusion layers (12 and 13) which are formed on both sides of the gate (11) and serve as a source and a drain; measurement contacts (15 and 16) which are provided at distances from the gate (11) on the diffusion layers (12 and 13); metal layers (28 and 29) which are electrically isolated; and floating contacts (25 and 26) which are provided between the gate (11) and the measurement contacts (15 and 16) to connect the metal layers (28 and 29) with the diffusion layers (12 and 13). The measurement method includes the steps of: measuring a CR dependence; and measuring a CW/W dependence. In the step of measuring the CR dependence, the CR dependence of the DC characteristic of each of the plurality of semiconductor evaluation elements is measured in the case where a ratio CW/W between a contact width CW of each of the floating contacts and a transistor width W of each of the semiconductor evaluation elements is fixed to a predetermined value and distances CR between the gate and the floating contacts are different from one another. In the step of measuring the CW/W dependence, the CW/W dependence of the DC characteristic of each of the plurality of semiconductor evaluation elements is measured in the case where the distance CR between the gate and each of the floating contacts is fixed to a predetermined value and the ratios CW/W between the contact width CW of the floating contacts and the transistor widths W of the semiconductor evaluation elements are different from one another.

According to the present invention, it is possible to provide the semiconductor evaluation element capable of analytically estimating the amount of DC variation of the MOS transistor which is caused by the formed contacts, the semiconductor integrated circuit device including the semiconductor evaluation element, and the evaluation method.

BRIEF DESCRIPTION OF THE DRAWINGS

The above and other objects, advantages and features of the present invention will be more apparent from the following description of certain preferred modes taken in conjunction with the accompanying drawings, in which:

FIG. 6 shows a CW/W dependence of the on-current ratio ΔIon of the MOS transistor according to the embodiment of the present invention in the case where the transistor width of the MOS transistor is changed; and FIG. 7 shows a CR-CW/W matrix in the embodiment of the present invention.

DETAILED DESCRIPTION OF THE PREFERRED EMBODIMENT

An embodiment of the present invention is described with reference to the attached drawings. The number of contacts and a contact position are estimated as contact factors causing a change in stress. Therefore, the dependence on the contact position is separated from the dependence on the number of contacts to measure a DC characteristic. The DC characteristic is preferably measured at a predetermined gate length L.

Figure 1A:
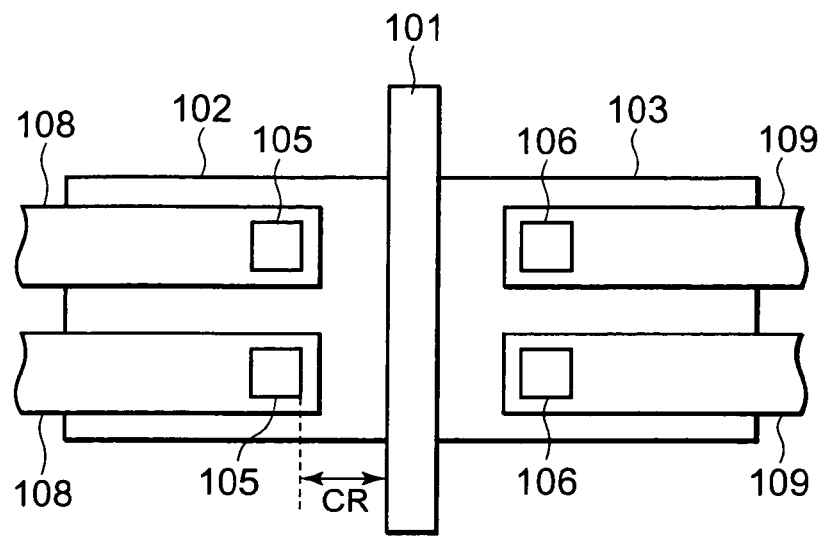
FIGS. 1A and 1B show examples of a layout pattern for measuring a DC characteristic of a MOS transistor.
Figure 1B:
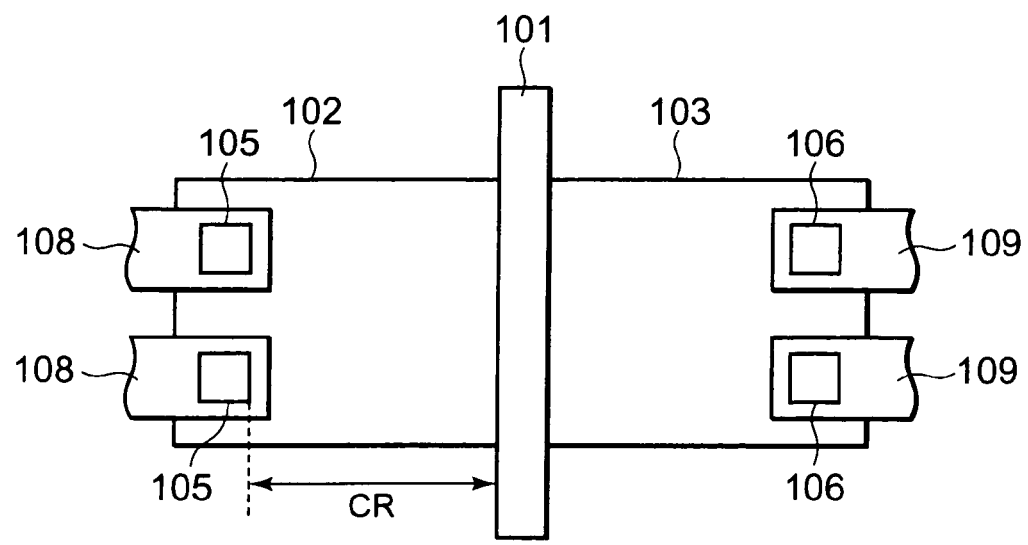
Figure 2A:
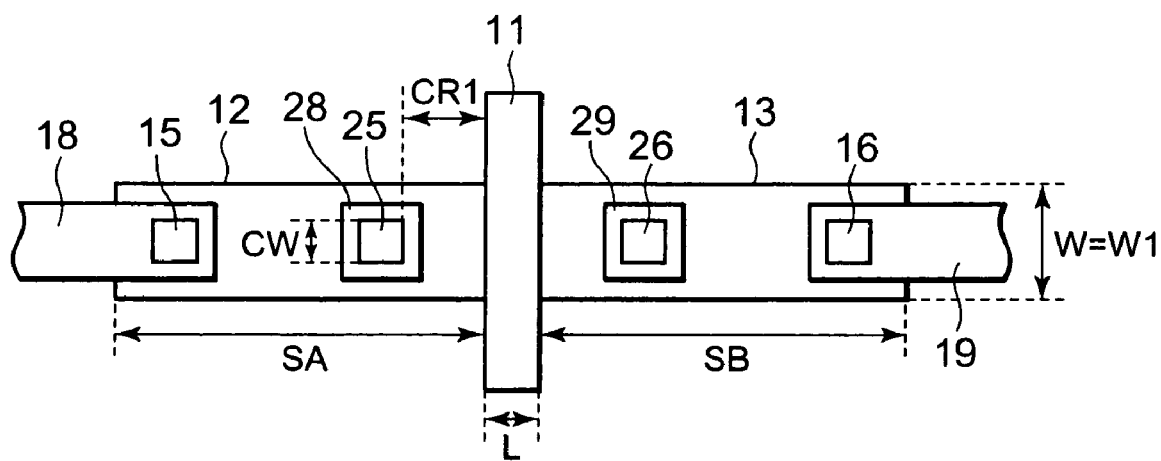
FIGS. 2A and 2B show examples of a layout pattern for measuring a DC characteristic of a MOS transistor according to an embodiment of the present invention.
Figure 2B:
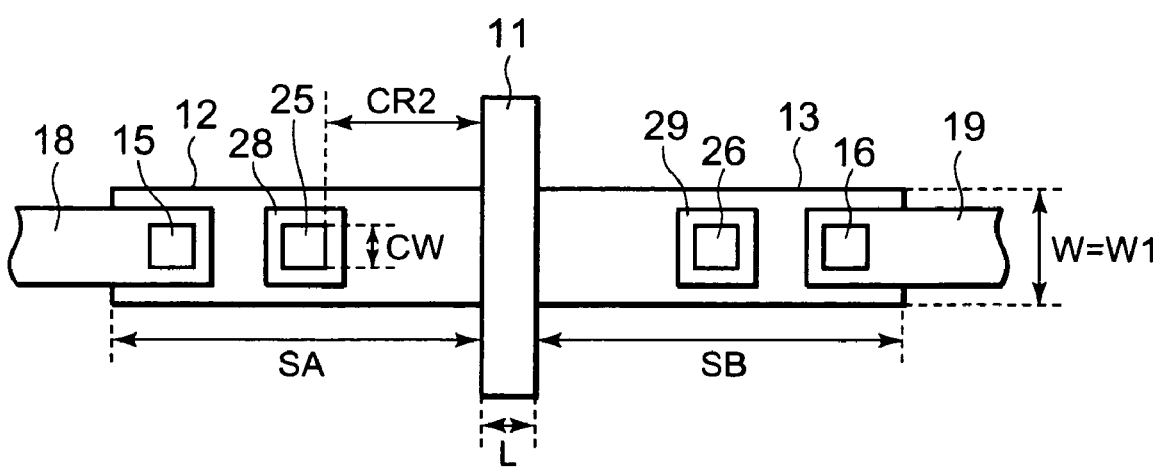

FIGS. 2A and 2B show fundamental layout patterns of a test element group (TEG) of a MOS transistor according to the embodiment of the present invention. As shown in FIG. 2A, the MOS transistor having a transistor width W includes diffusion layers 12 and 13 which serve as a source and a drain and have diffusion layer lengths SA and SB. The MOS transistor further includes: metal layers 18 and 19 serving as source and drain electrodes; and contacts 15 and 16 for connecting the metal layers 18 and 19 with the diffusion layers 12 and 13. The MOS transistor further includes floating contacts 25 and 26 and floating metal layers 28 and 29, which are provided between a gate 11 and the contacts 15 and 16 connected with the source and drain electrodes. A group including the diffusion layer 12, the metal layer 18, the floating metal layer 28, the contact 15, and the floating contact 25 and a group including the diffusion layer 13, the metal layer 19, the floating metal layer 29, the contact 16, and the floating contact 26 are preferably symmetrically arranged with respect to the gate 11.

The diffusion layer lengths SA and SB are set to an extremely large value, for example, approximately 1 µm to 3 µM. The contacts 15 and 16 are provided in positions farthest from the gate 11 on the diffusion layers 12 and 13 so as not to interfere with the floating contacts 25 and 26. The floating contacts 25 and 26 are not connected with other circuits and thus not applied with a voltage or supplied with a current. Therefore, the floating contacts 25 and 26 are electrically isolated. The floating contacts 25 and 26 apply stresses to portions of the diffusion layers 12 and 13 which are located therearound. When voltages are applied between the contacts 15 and 16 and the gate 11, currents flowing through the contacts 15 and 16 are observed to measure the DC characteristic of the MOS transistor. As described above, the floating contacts 25 and 26 are provided between the measurement contacts 15 and 16 and the gate 11 on the diffusion layers, so the DC characteristic of the MOS transistor which is affected by the formed floating contacts is measured.

TEG layout patterns for analyzing the dependence on the contact position in the case where a ratio CW/W between a contact width CW and a transistor width W is set to a predetermined value are provided (Pattern-1). That is, as shown in FIGS. 2A and 2B, patterns are provided in which a gate length L is set to a fixed value, the transistor width W is set to W1, and a distance CR between each of the floating contacts 25 and 26 and the gate 11 is changed. In this case, the transistor width W is preferably a minimum transistor width.

Figure 3A:
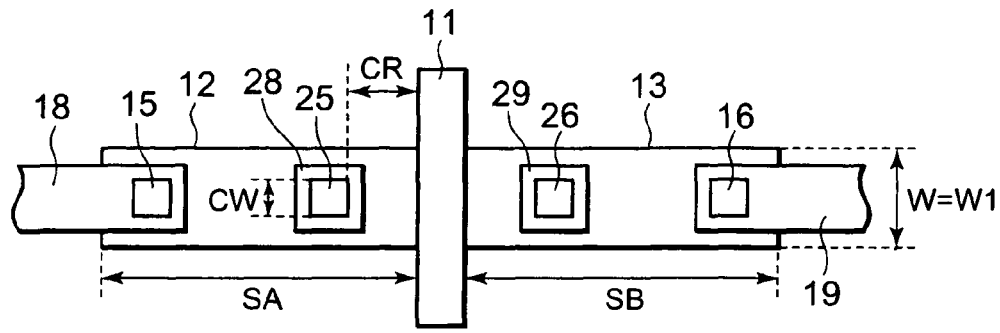
FIGS. 3A to 3C show examples of the layout pattern for measuring the DC characteristic of the MOS transistor according to the embodiment of the present invention in the case where a transistor width of the MOS transistor is changed at a predetermined ratio CW/W.
Figure 3B:
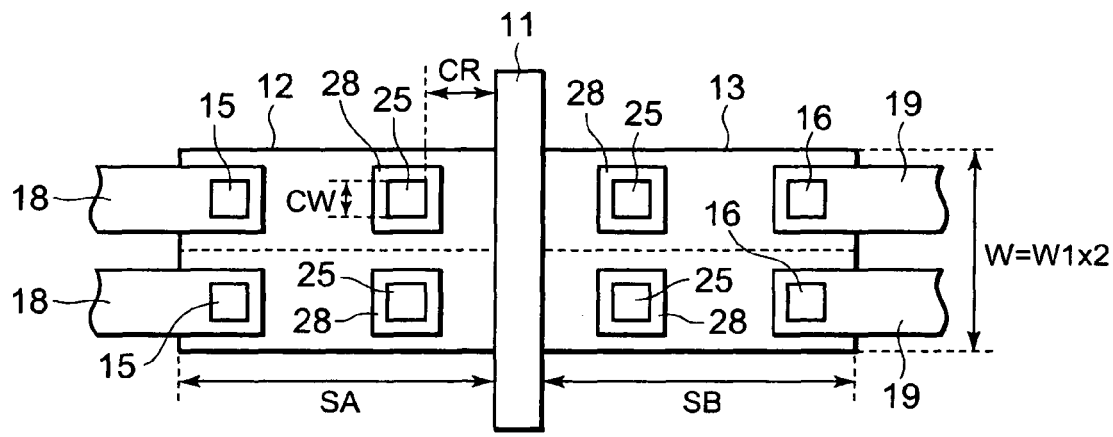

In order to examine the influence of the transistor width W, Pattern-1 (FIG. 3A) is used as a basic unit cell and a pattern as shown in FIG. 3B (Pattern-2) is provided in which the total transistor width W is two times the transistor width of the basic unit cell (W=W1×2). The ratio CW/W between the contact width and the transistor width is set to the same value as in the case of Pattern-1 in order to eliminate the influence of the ratio CW/W between the contact width and the transistor width.

Figure 3C:
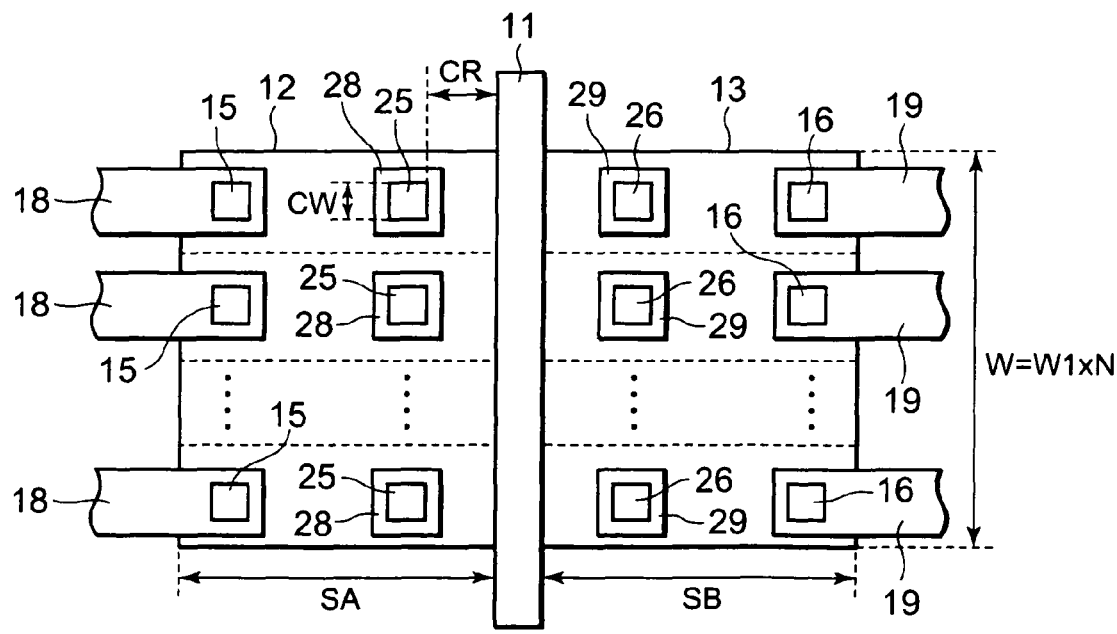

As shown in FIG. 3C, a TEG pattern (Pattern-3) is provided in which the total transistor width W is N times the transistor width of the basic unit cell (W=W1×N (N=3, 4, . . . , 10, . . . )). That is, not the ratio CW/W between the transistor width W and the contact width CW but the total transistor width W is changed.

With respect to the change in stress which is caused by contact, when the ratio CW/W between the contact width and the transistor width is the predetermined value, the MOS transistor whose total transistor width W is N times can be replaced by a parallel transistor group including N parallel connected transistors each having the transistor width W1. When the ratio CW/W is the predetermined value, an on-current Ion (W=W1) at N=1 can be expressed as a function of the distance CR between each of the floating contacts 25 and 26 and the gate 11 as follows.

$$\mathrm{Ion}(W{=}W1){=}f1(CR)$$

Therefore, the on-current of the MOS transistor whose total transistor width W is N times is expressed by the following expression.

$$\mathrm{Ion}(W{=}W1{\times}N){=}f1(CR){\times}N$$

Figure 4:
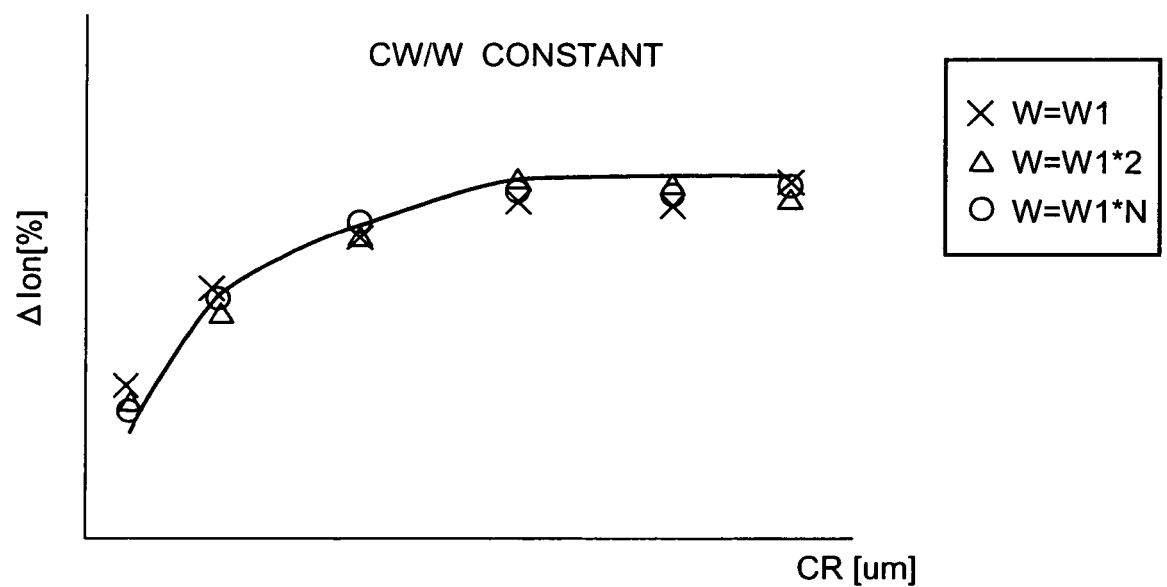
FIG. 4 shows a CR dependence of an on-current ratio ΔIon of the MOS transistor according to the embodiment of the present invention in the case where the transistor width of the MOS transistor is changed at the predetermined ratio CW/W.

That is, when the ratio CW/W between the contact width and the transistor width is the predetermined value, as is apparent from, for example, FIG. 4, an on-current ratio ΔIon has a predetermined dependence regardless of the total transistor width W (W1×N). In FIG. 4, the ordinate indicates the amount of change in on-current ratio.

Figure 5A:
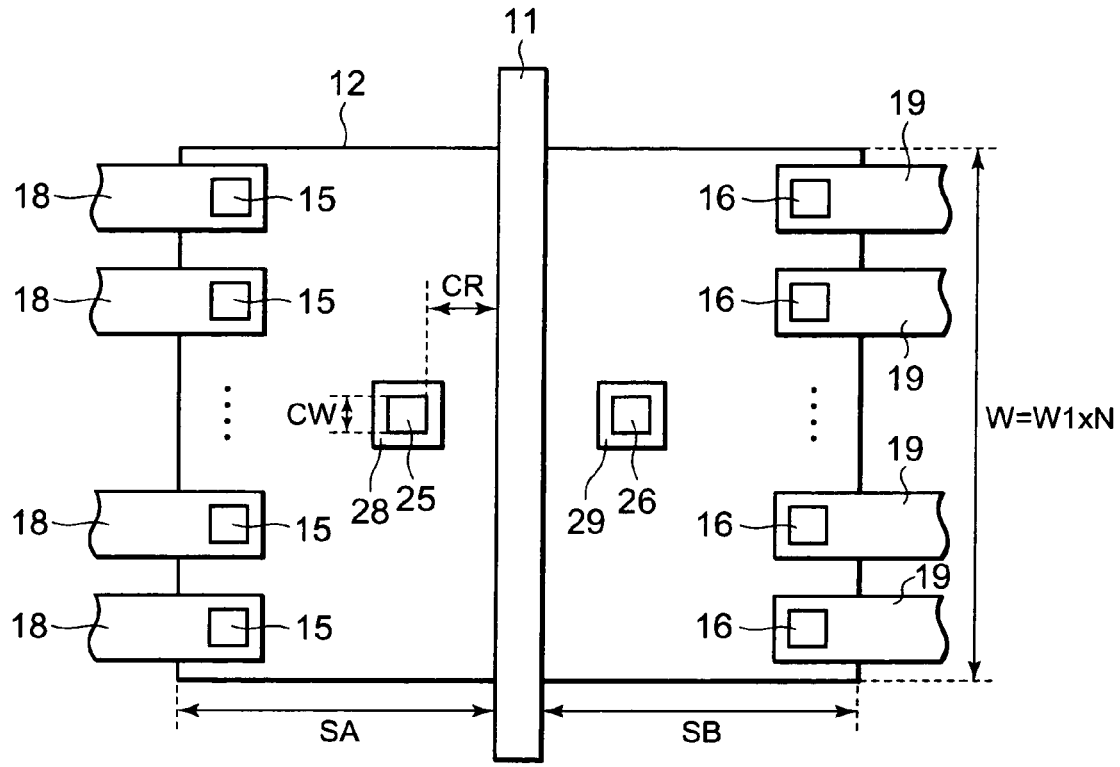
FIGS. 5A and 5B show examples of the layout pattern for measuring the DC characteristic of the MOS transistor according to the embodiment of the present invention in the case where the ratio CW/W is changed at a predetermined distance CR.
Figure 5B:
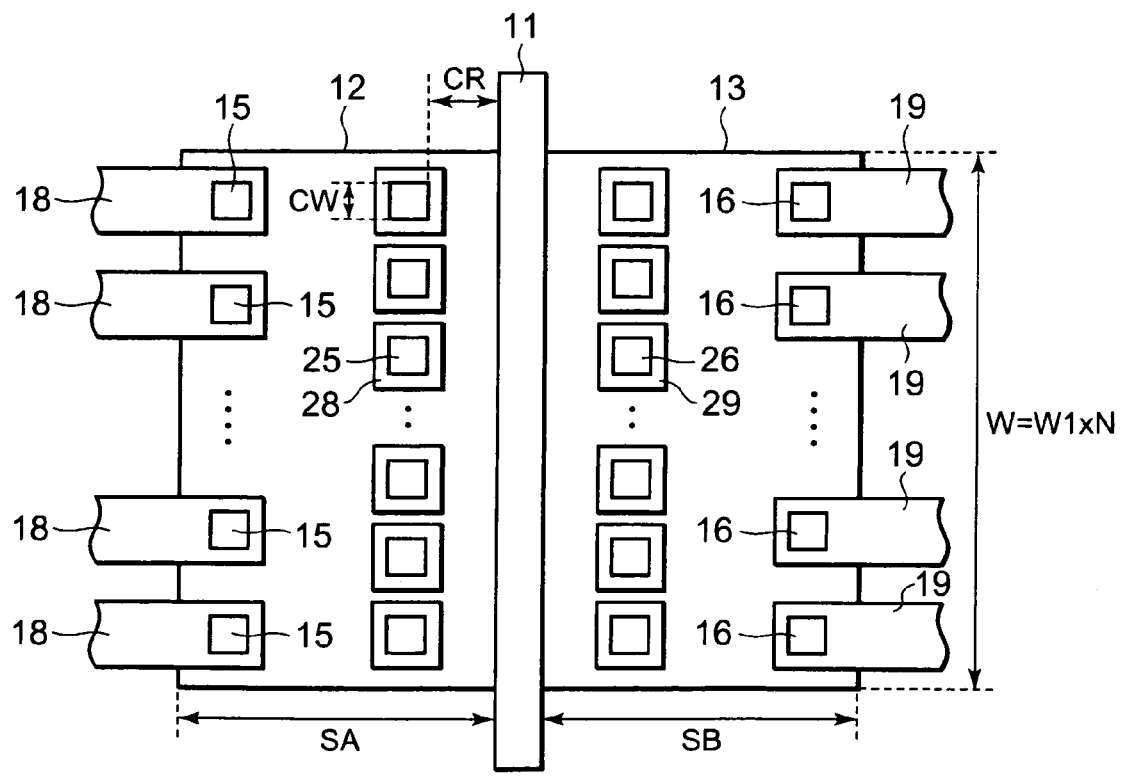

Next, patterns for analyzing the dependence on the number of contacts are provided. That is, as shown in FIGS. 5A and 5B, patterns are provided in which the total transistor width W of the MOS transistor is set to W1×N, the distance CR between each of the floating contacts 25 and 26 and the gate 11 is set to a fixed value, and the number of each of the floating contacts 25 and 26 is changed. FIG. 5A shows the pattern in which one pair of floating contacts 25 and 26 is provided for the MOS transistor whose total transistor width W is equal to W1×N. FIG. 5B shows the pattern in which M pairs of floating contacts 25 and 26 are provided for the MOS transistor having the total transistor width W as in the case of FIG. 5A.

As described above, the positions of the floating contacts 25 and 26 are not shifted and the number of each of the floating contacts 25 and 26 is changed. When the on-current is measured with such states, as is apparent from an example shown in FIG. 6, the on-current ratio ΔIon has a predetermined dependence regardless of the total transistor width W (W1×N) in the case where the distance CR is a predetermined value. In this case, the ordinate indicates the amount of change in the on-current ratio.

Therefore, when the ratio CW/W between the contact width and the transistor width is the predetermined value, the on-current ratio ΔIon between the on-current Ion in the case where the floating contacts are not provided and the on-current Ion in the case where the floating contacts are provided has the predetermined dependence regardless of the total transistor width W (W1×N). In addition, when the distance CR indicating the position of each of the floating contacts is the predetermined value, the on-current ratio ΔIon has the predetermined dependence regardless of the total transistor width W (W1×N). Thus, a matrix table as shown in FIG. 7 can be obtained from the CR dependence of the on-current ratio ΔIon and the CW/W dependence of the on-current ratio ΔIon. The matrix table shows a relationship between the distance CR indicating the position of each of the floating contacts and the ratio CW/W between the contact width and the transistor width. When the matrix table is used, it is possible to obtain the on-current ratio ΔIon based on the contact position and the number of contacts to the arbitrary total transistor width W.

That is, assume that the floating contacts are located at an infinite point when the ratio CW/W between the contact width and the transistor width in a state in which the floating contacts are not provided is equal to 0. Then, the on-current ratio ΔIon is obtained relative to the on-current Ion in the case of CR=∞.

For example, first, the CW/W between the contact width and the transistor width is set to a fixed value of 30%. The distance CR indicating the position of each of the floating contacts is changed to measure the on-current, thereby obtaining the on-current ratios ΔIon. The on-current ratios ΔIon are listed in the columns of the matrix table. Next, the distance CR indicating the position of each of the floating contacts is set to a fixed value. The number of floating contacts is changed (CW/W is changed) to measure the on-current, thereby obtaining the on-current ratios ΔIon. The on-current ratios ΔIon are listed in the rows of the matrix table. A value of the on-current ratio ΔIon based on the contact position and the number of contacts in the matrix table is obtained from the row/column relationship. That is, the on-current ratio ΔIon for each of points in the matrix table can be obtained without measuring on-currents for all the points therein.

The analyses on the on-current ratio ΔIon are described above. The method for the analyses can be also applied to the case of a threshold voltage Vth. The analyses on the threshold voltage Vth are performed based on a difference ΔVth between the threshold voltage Vth in the case where the floating contacts are not provided and the threshold voltage Vth in the case of an arbitrary contact position and the arbitrary number of contacts.

As described above, the floating contacts different from the source and the drain between which a current flows are provided in the TEG layout pattern to separate diffusion layer resistance components from the influence of stress caused by contact. The measurement contacts 15 and 16 for connecting the source and the drain with the metal layers are provided in the predetermined positions without depending on the gate length L, the transistor width W, and the distance CR indicating the position of each of the floating contacts. The measurement contacts are desirably provided near the positions farthest from the gate on the diffusion layers. In order to eliminate a difference between densities of currents flowing through the measurement contacts, one pair of measurement contacts (source and drain) is provided for the minimum transistor width W (W1). When the TEG layout patterns are provided, the diffusion layer resistance components and the difference between the densities of currents flowing through the measurement contacts can be eliminated.

As described above, when the TEG layout patterns are provided, the diffusion layer resistance components and the contact current density difference can be eliminated, so the real influence of stress on the channel region which is caused by contact can be determined based on the amount of change in DC characteristic of the MOS transistor. The method for the analyses based on the ratio CW/W between the contact width and the transistor width can be applied even when the transistor width W is changed to any width. That is, when the TEG layout patterns and the method for the analyses as described above are used, the dependence on the stress caused by contact can be quantitatively analyzed. The dependence on the distance between the contact and the gate and the dependence on the number of contacts (density) can be determined.

What is claimed is:

1. A semiconductor device including a plurality of semiconductor evaluation elements, each of the semiconductor evaluation elements comprising:
   a gate;
   diffusion layers which are formed on both sides of the gate and serve as a source and a drain;
   measurement contacts formed on each of the diffusion layers and provided at distances from the gate;
   floating contacts formed on each of the diffusion layers and provided between the gate and the measurement contacts; and
   measurement pads coupled only to the measurement contacts and the gate, wherein, in each of the plurality of the semiconductor evaluation elements, a distance between the gate and each of the floating contacts is different from one another, and a number of the floating contacts and a transistor width are fixed to predetermined values.

2. The semiconductor device according to claim 1, wherein, in each of the plurality of the semiconductor evaluation elements, a number of the floating contacts is different from one another, and a distance between the gate and each of the floating contacts is fixed to a predetermined value.

3. The semiconductor device according to claim 2, wherein, in each of the plurality of the semiconductor evaluation elements, a number of the measurement contacts is the same as a number of the floating contacts.

4. The semiconductor device according to claim 2, wherein, in each of the plurality of the semiconductor evaluation elements, a transistor width is fixed to a predetermined value.

5. A measurement method using the plurality of the semiconductor evaluation elements according to claim 4, the measurement method comprising:
   measuring a dependence of a DC characteristic of each of the plurality of the semiconductor evaluation elements on a number of floating contact.

6. A measurement method using the plurality of the semiconductor evaluation elements according to claim 1, the measurement method comprising:
   measuring a dependence of a DC characteristic of each of the plurality of the semiconductor evaluation elements on a distance between the gate and each of the floating contacts.

7. The measurement method according to claim 6, wherein the DC characteristic comprises a characteristic of an on-current obtained by measuring currents flowing through the measurement contacts of the plurality of the semiconductor evaluation elements and applying a predetermined gate voltage.

8. The measurement method according to claim 6, wherein the DC characteristic comprises a characteristic of a threshold voltage obtained by measuring currents flowing through the measurement contacts of the plurality of the semiconductor evaluation elements.

* * * * *